United States Patent [19]

Miyajima

[11] 4,293,377
[45] Oct. 6, 1981

[54] MANUFACTURING METHOD FOR CIRCUIT BOARD

[75] Inventor: Masanobu Miyajima, Tsuchiura, Japan

[73] Assignee: Rogers Corporation, Rogers, Conn.

[21] Appl. No.: 52,475

[22] Filed: Jun. 27, 1979

[30] Foreign Application Priority Data

Jun. 29, 1978 [JP] Japan ................................ 53-78954

[51] Int. Cl.³ ............................................. C23F 1/02
[52] U.S. Cl. ................................... 156/656; 29/841; 29/846; 156/659.1; 156/661.1; 156/902; 174/68.5; 427/97
[58] Field of Search ................. 29/848, 852, 855, 856, 29/858, 859, 841, 846; 156/656, 655, 659.1, 661.1, 901, 902; 427/96, 97, 197, 198, 259, 287; 174/68.5; 430/312, 313, 314, 316, 317, 318

[56] References Cited

U.S. PATENT DOCUMENTS

| | | | |
|---|---|---|---|
| 2,673,142 | 3/1954 | Glynn | 156/659.1 |
| 3,881,884 | 5/1975 | Cook et al. | 156/659.1 X |
| 4,127,436 | 11/1978 | Friel | 156/902 X |
| 4,172,757 | 10/1979 | Thornburg | 156/634 X |

FOREIGN PATENT DOCUMENTS 49-44790  11/1974  Japan ................................... 156/653

*Primary Examiner*—William A. Powell
*Attorney, Agent, or Firm*—Fishman and Van Kirk

[57] ABSTRACT

An electrical circuit board is prepared by application, over a conductive foil which is supported on a substrate, of a hot-melt resin in accordance with the desired circuit pattern. The resin may be applied by screen printing and, after curing, will function as a resist coating for the conductive material during subsequent chemical removal of the foil from unprotected areas to form the individual conductors of the pattern. During subsequent connection of the circuit to other components contact areas on the individual conductors may be exposed by contacting the resin coating with molten solder.

7 Claims, 7 Drawing Figures

Fig. 1
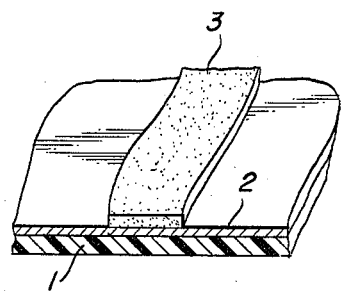
Fig. 2
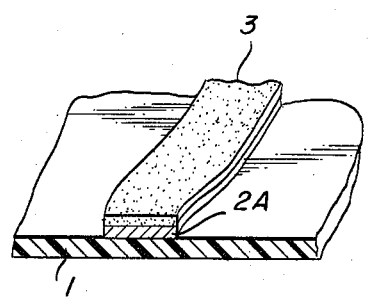
Fig. 3
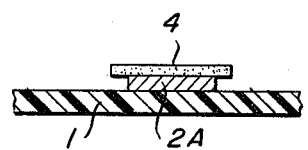
Fig. 4
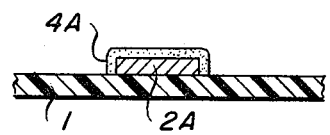
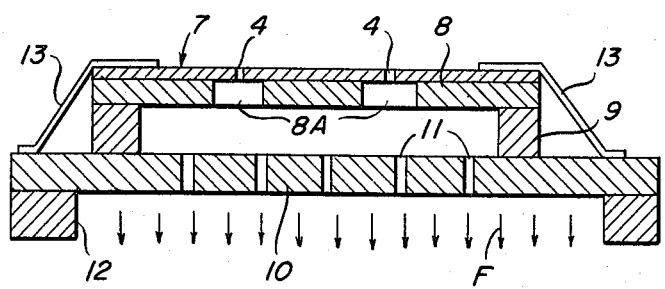
Fig. 7

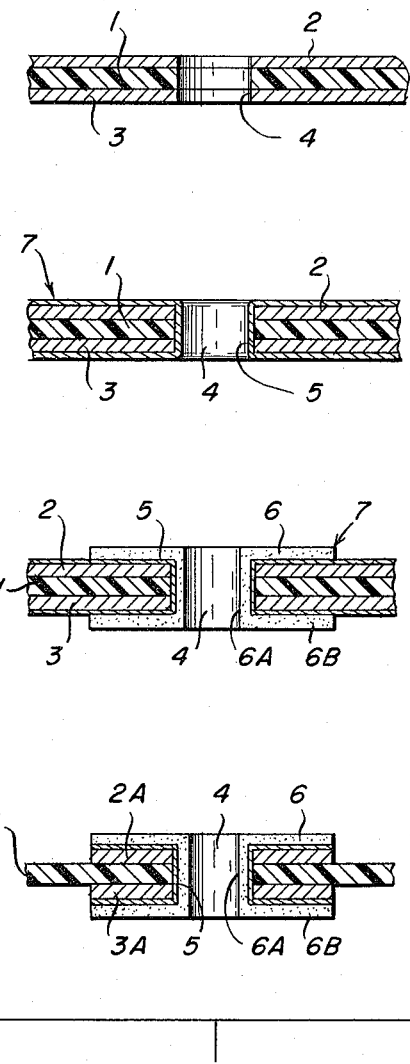
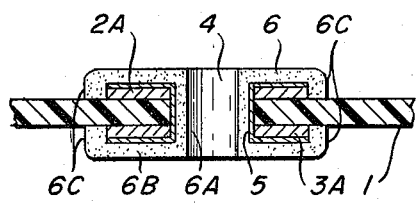
Fig. 5
Fig. 6

MANUFACTURING METHOD FOR CIRCUIT BOARD

BACKGROUND OF THE INVENTION (1) Field of the Invention

The present invention relates to electrical circuits and particularly to circuits characterized by plural conductive paths supported on a non-conductive substrate. More specifically, this invention is directed to a method for the manufacture of electrical circuits from an intermediate comprising a layer of conductive material supported on a sheet of insulating material. Accordingly, the general objects of the present invention are to provide novel and improved articles and methods of such character.

(2) Description of the Prior Art

Techniques for the production of "printed" electrical circuits are well known in the art. One of the more common circuit fabrication techniques is photoresist etching wherein a laminate comprising a copper foil bonded to a non-conducting substrate is converted into a circuit board having the desired conductor pattern by a combined optical and chemical process. A photoresist process consists of the steps of coating the entire conductive surface of the laminate with either a negative or positive type resist material, positioning either a negative or positive type of film bearing in proper orientation relative to the resist layer, exposing the resist layer to light through the film, "developing" the resist layer in a multi-step procedure to expose the areas of the copper foil which are to be removed, chemically etching away the exposed copper and removal of the residual resist coating. Photo-resist techniques, such as that generally described, are limited as to production rate because of the large number of manufacturing steps, registration problems and because of the comparatively long time required to perform certain of the process steps. Furthermore, poor yield often results from careless performance of the step of removal of the residual resist coating.

It is further to be observed that prior art techniques, such as the photo-resist process generally described above, often require the performance of additional coating steps subsequent to removal of the residual resist material. Coating may be required to provide an insulating layer, in the form of a paint or varnish or a cover film, over the circuit conductors and the necessity of pattern matching may make the provision of such a coating a time-consuming operation which further disturbs productivity.

A further deficiency in the prior art resides in the fact that the conductive material exposed by removal of the residual resist coating is subject to oxidation and/or surface contamination by material such as oily dust. Such oxidation or surface contamination will impede the subsequent attachment of circuit elements to the formed circuit and thus must be guarded against by procedures which are both time consuming and labor intensive.

SUMMARY OF THE INVENTION

The present invention overcomes the above briefly-discussed and other deficiencies and disadvantages of the prior art by providing a novel and improved method for the manufacture of circuit boards and the unique boards resulting from the practice of that method. The method of the present invention is characterized by high productivity when compared to the prior art. Circuit boards in accordance with the present invention have the unique characteristic that the conductors thereon may be electrically and mechanically joined to other circuit elements by means of a simplified one-step type process.

In accordance with a preferred embodiment of the present invention a desired circuit pattern is defined on a laminate comprising a conductive foil bonded to a non-conducting substrate by screen printing a hot-melt resin on the exposed surface of the conductive foil so as to define the desired conductor pattern. The thus applied resin is cured and the conductive foil in the exposed areas subsequently removed by chemical etching. The cured resin provides an insulating, protective coating for the conductor pattern which, should it be desired to attach a circuit element to one of the conductors of the pattern, may be removed in the contact area merely by the application of heat. If the circuit board is to be provided with plated-through-hole-type connectors, the printing of the hot-melt resin may be performed while applying a low pressure to the side of the circuit board opposite to that on which the pattern is being printed whereby the resin will also coat the conductive material on the surfaces of the through holes.

BRIEF DESCRIPTION OF THE DRAWING

The present invention may be better understood and its numerous objects and advantages will become apparent to those skilled in the art by reference to the accompanying drawing wherein like reference numerals refer to like elements in the several figures and in which:

FIG. 1 is a partial, cross-sectional, perspective view of a circuit board intermediate depicting the first step in the practice of a first embodiment of the present invention;

FIG. 2 is a view similar to FIG. 1 depicting the practice of a second step in accordance with the preferred embodiment of the present invention;

FIG. 3 is a cross-sectional side view of the article of FIGS. 1 and 2 on an enlarged scale, depicting an optional third step which may be employed in the practice of the present invention;

FIG. 4 is a view similar to FIG. 3 depicting a further step which may be practiced subsequent to the step resulting in the article of FIG. 3 in accordance with the present invention;

FIG. 5 illustrates the process of the present invention applied to a circuit board having through-hole connectors;

FIG. 6 is a view similar to FIG. 5, on an enlarged scale, which shows the results of further processing steps which may be performed on the product resulting from practice of the process as depicted in FIG. 5; and FIG. 7 is a schematic illustration of apparatus which may be employed in practice of the process depicted in FIG. 5.

DESCRIPTION OF THE PREFERRED EMBODIMENT

With reference to the drawing, and particularly to FIG. 1, a circuit board; i.e., a non-conductive substrate; is indicated at 1. The circuit board has been previously prepared by lamination, to at least one surface thereof, of a copper foil 2. In accordance with the present invention, a hot-melt resin, indicated at 3, is applied to the exposed surface of the copper foil 2 in accordance with the conductor pattern it is desired to form on the circuit board. The resin 3 is preferably applied by screen printing. In accordance with the preferred embodiment of the invention, the hot-melt resin is polyurethane which has, in part, been selected because of its printability. The applied resin will correspond exactly to the shape of and may correspond exactly to the size of the circuit pattern to be formed. In one reduction to practice the resin was applied in a coating having a thickness in the range of 10 to 20 microns and, after application, the resin was cured by being subjected to a temperature of 150° C. for approximately one hour.

Referring to FIG. 2, after curing of resin 3, the copper foil 2 is removed from the circuit board 1 in the exposed areas by means of a conventional etching process. Subsequent to etching, as depicted in FIG. 2, only the conductors 2A which define the desired circuit pattern will remain and these conductors will be provided with an over-laying coating of cured resin 3. The coating of resin 3, which has functioned as a resist during the etching process, further functions as a protective insulating coating for the conductors of the pattern of the end product without any additional processing steps.

Since resin 3 is a hot-melt resin, it is not necessary to perform a mechanical or chemical removal procedure in order to join components to the conductors of the circuit pattern. That is, use of the circuit board of FIG. 2 in the production of an electrical or electronic device merely requires the exposure of resin 3 to fused solder in the desired contact areas whereupon the resin will melt away and a solder joint to the conductors may be formed. A further advantage of the present invention is that, subsequent to the manufacturing process as depicted in FIGS. 1 and 2, and prior to further use, the top surfaces of the conductive areas on the circuit board are protected by the resin 3 and thus potential contact areas will not oxidize or become coated with contaminants such as oily dust which might interfer with the formation of a good solder joint.

After completion of the process of FIGS. 1 and 2, the side surfaces of the conductors 2A remain uncoated. Should it be deemed necessary or desirable to completely insulate the conductors formed on the circuit board, the resin 3 will be applied in bands which are wider than the desired width of the conductors. Subsequently, by over etching, the copper foil will be undercut as shown in FIG. 3 whereby the resin, indicated in FIG. 3 at 4, extends outwardly past the edges of the conductors of the pattern. Subsequently, as depicted in FIG. 4, the circuit board may be exposed to heat of sufficient magnitude to cause the softening of the resin whereby it will "drape" down over the edges of the conductors 2A as indicated at 4A and, upon removal of heat, shrink to provide fully insulated conductors as shown.

In the interest of enhancing circuitry density, it is common in the art for circuit boards to be provided with conductor patterns on the opposed faces thereof. Referring to FIG. 5, step (1), layers of copper foil 2 and 3 are respectively bonded to the opposite sides of substrate 1. In order to provide for electrical connection between the conductors on the opposite faces of the circuit board, the board is provided with a pattern of through holes such as the hole indicated at 4. While there are many methods of establishing electrical connection between the opposite sides of the circuit board via the through holes, one of the more common procedures is to employ non-electrolytic chemical plating to deposit a metal coating, indicated at 5 in step (2) of FIG. 5, on the inner surface of through hole 4. Referring now generally to FIGS. 5 and 7, the board produced through the practice of steps (1) and (2) of FIG. 5, which has been indicated generally at 7, is placed on a suction board 8 of a vacuum suction device. The suction board 8 is provided with the pattern of holes 4 in circuit board 1; i.e., the holes in the suction board 8 and circuit board 7 are placed in registration. As may be seen from FIG. 7, the holes in suction board 8 are of larger diameter than the holes in circuit board 7. The circuit board 7 may be secured in position on suction baord 8 by means of tape as indicated at 13; the circuit board being supported over the bed 10 of the vacuum suction device by means of a gasket 9. The bed 10 of the vacuum suction device is provided with a larger number of small holes 11 and, during operation, air flow is as indicated by the arrow F of FIG. 7. The vacuum suction device further includes a flange 12 on which bed 10 is supported.

Continuing to refer to step (3) of FIG. 5, with the circuit board 7 positioned on suction board 8 as shown in FIG. 7 and the vacuum pump in operation, the hot-melt resin 6 is applied to the exposed surface of the circuit board in accordance with the desired conductor pattern. The resin will, as described above, preferably be polyurethane and will be applied by screen printing. Because of the applied low pressure, the resin 6 will flow downwardly along the surfaces of the plated holes 4, thereby forming a coating 6A thereon. Next, the circuit board 7 is turned over and either a new suction board 8 installed or suction board 8 reversed so as to again place the hole patterns in the circuit board and suction board in registration. Thereafter, the process is repeated to apply the resin in accordance with the conductor pattern desired on the second surface of board 7. In FIG. 5, at step (3), the resin on the second side of the board is indicated at 6B. After application of the hot-melt resin to both sides of the board has been completed, the resin is cured and the board 7 is etched in a single step to remove all exposed copper foil. This results in the completed product shown at step (4) of FIG. 5.

As in the case of the product of FIG. 2, as discussed above, the edges of the conductors on the opposite surfaces of circuit board 7 are exposed in the product of FIG. 5, step (4). If it is deemed necessary or desirable to insulate these conductor edges, this may be accomplished following the same procedure as described above with respect to FIGS. 3 and 4. If this is done, a product as partially shown in FIG. 6 will result wherein the resin will encapsulate the side edges of the conductors as indicated at 6C.

As will be obvious to those skilled in the art from the foregoing description, the present invention has the attribute that the resist pattern-forming process serves the dual function of defining the circuit pattern for etching and providing an insulating and protecting coating for the conductors of the end product. Further, in accordance with the present invention the formation of the resist pattern is accomplished without the necessity of complicated position matching as has previously been required in the production of a negative of the desired conductor pattern and in the subsequent exposure of a photo-resist material through such negative. Accordingly, the present invention offers significant improvements in productivity. The present invention also presents the possibility of producing a very fine and precision conductor pattern on the opposite sides of the circuit board and inter-connection of such pattern via conductive through holes since the through-hole conductors are protected during the circuit pattern formation process by the resin which has been drawn down into the holes by suction. Additionally, the connection of other circuit elements to conductors on the circuit board is facilitated, and the possibility of poor solder joints due to oxidation or other surface contamination substantially eliminated, since the surface coating of resin is melted and removed from contact areas by touching melted solder to such areas.

While preferred embodiments have been shown and described, various modifications and substitutions may be made thereto without departing from the spirit and scope of this invention. Accordingly, it is to be understood that the present invention has been described by way of illustration and not limitation.

What is claimed is:

1. A method for the manufacture of a circuit board from an intermediate comprising a laminate of a non-conductive substrate and a layer of electrically conductive material secured to at least a first surface of the substrate, said method comprising the steps of:
    defining a conductor pattern on the exposed surface of the conductive layer by screen printing a hot-melt resin onto the said conductive material surface;
    curing the resin by the application of heat; and
    removing the conductive layer in areas not covered by the cured resin to form discrete conductors.

2. The method of claim 1 wherein the resin is a polyurethane and wherein the conductive material is removed by a chemical etching, said method further comprising the steps of:
    continuing the removal of the conductive material until the resin has been undercut; and
    heating the substrate to cause the resin to flow downwardly to cover the side edges of the conductors.

3. A method for the manufacture of a circuit board from an intermediate comprising a laminate of a non-conductive substrate having first and second layers of electrically conductive material secured on opposed surfaces thereof, the first and second electrically conductive layers being interconnected by means of at least a first through-hole extending between the said opposed substrate surfaces and having conductive material on the walls thereof, said method comprising the steps of:
    defining a conductor pattern on the exposed surface of the first of said electrically conductive layers by screen printing a hot-melt resin onto the said surface;
    causing the uncured resin to flow into said through-hole and cover the conductive material on the wall thereof during the screen printing over the exposed surface of the first electrically conductive layer;
    screen printing the hot-melt resin on the exposed surface of the said second electrically conductive layer to thereby define a conductor pattern on said second electrically conductive layer;
    curing the resin by the application of heat; and
    removing the conductive layer in areas not covered by the cured hot-melt resin to form discrete conductors on the opposed surfaces of said substrate.

4. The method of claim 3 wherein the resin is simultaneously cured on both layers of conductive material and the exposed conductive material is simultaneously removed from both sides of the substrate by chemical etching.

5. The method of claim 1 wherein the step of coating the conductive material on the wall of the through hole includes:
    establishing a pressure differential across the substrate to draw the resin into the thorugh hole during the screen printing.

6. The method of claim 5 wherein the resin is a polyurethane and wherein the conductive material is removed by a chemical etching, said method further comprising the steps of:
    continuing the removal of the conductive material until the resin has been undercut; and
    heating the substrate to cause the resin to flow downwardly to cover the side edges of the conductors.

7. The method of claim 5 wherein the resin is simultaneously cured on both layers of conductive material and the exposed conductive material is simultaneously removed from both sides of the substrate by chemical etching.

* * * * *